(12) United States Patent
Wang et al.

(10) Patent No.: US 11,903,253 B2
(45) Date of Patent: Feb. 13, 2024

(54) DISPLAY SUBSTRATE INCLUDING A RETAINING WALL IN A FRAME AREA AND DISPLAY DEVICE HAVING THE SAME

(71) Applicants: MIANYANG BOE OPTOELECTRONICS TECHNOLOGY CO., LTD., Sichuan (CN); BOE TECHNOLOGY GROUP CO., LTD., Beijing (CN)

(72) Inventors: Lina Wang, Beijing (CN); Zifeng Wang, Beijing (CN); Haoyuan Fan, Beijing (CN); Jenyu Lee, Beijing (CN); Yong Hu, Beijing (CN); Zerui Zhang, Beijing (CN); Dali Li, Beijing (CN)

(73) Assignees: MIANYANG BOE OPTOELECTRONICS TECHNOLOGY CO., LTD., Mianyang (CN); BOE TECHNOLOGY GROUP CO., LTD., Beijing (CN)

( * ) Notice: Subject to any disclaimer, the term of this patent is extended or adjusted under 35 U.S.C. 154(b) by 234 days.

(21) Appl. No.: 17/459,319

(22) Filed: Aug. 27, 2021

(65) Prior Publication Data
US 2022/0238618 A1 Jul. 28, 2022

(30) Foreign Application Priority Data
Jan. 28, 2021 (CN) .......................... 202110121161.6

(51) Int. Cl.
*H01L 27/12* (2006.01)
*H10K 59/121* (2023.01)
(Continued)

(52) U.S. Cl.
CPC ....... *H10K 59/1213* (2023.02); *G06F 3/0412* (2013.01); *H10K 50/844* (2023.02);
(Continued)

(58) Field of Classification Search
CPC ............ H10K 59/1213; H10K 59/122; H10K 59/1216; H10K 59/123; H10K 50/844
(Continued)

(56) References Cited

U.S. PATENT DOCUMENTS

2019/0006431 A1 1/2019 Won et al.
2020/0381653 A1 12/2020 Bang et al.

FOREIGN PATENT DOCUMENTS

| CN | 111192911 A | * | 5/2020 | ......... H01L 27/3244 |
| CN | 112018161 A | * | 12/2020 | ............ G06F 3/0412 |

OTHER PUBLICATIONS

Office Action for U.S. Appl. No. 17/789,543 dated Sep. 7, 2023, 11 pages.

* cited by examiner

*Primary Examiner* — Phuc T Dang
(74) *Attorney, Agent, or Firm* — Myers Bigel, P.A.

(57) ABSTRACT

A display substrate and a display device are disclosed. The display substrate includes a display area and a frame area, and the display substrate includes a substrate, a plurality of sub-pixels on a side of the substrate, the plurality of sub-pixels are configured to emit light in the display area, an encapsulation layer on a side of the plurality of sub-pixels away from the substrate, and a retaining wall located in the frame area, the retaining wall is located between the encapsulation layer and the substrate and includes a first sub-retaining wall, a second sub-retaining wall, and a transition area between the first sub-retaining wall and the second sub-retaining wall, the retaining wall includes at least one layer provided in the same layer, the at least one layer provided in the same layer continuously extends across the first sub-retaining wall, the second sub-retaining wall and the transition area.

20 Claims, 5 Drawing Sheets

(51) Int. Cl.
*G06F 3/041* (2006.01)
*H10K 50/844* (2023.01)
*H10K 59/122* (2023.01)
*H10K 59/123* (2023.01)
*H10K 59/124* (2023.01)
*H10K 59/40* (2023.01)

(52) U.S. Cl.
CPC ......... *H10K 59/122* (2023.02); *H10K 59/123* (2023.02); *H10K 59/124* (2023.02); *H10K 59/1216* (2023.02); *G06F 3/04164* (2019.05); *H01L 27/1255* (2013.01); *H10K 59/40* (2023.02)

(58) Field of Classification Search
USPC ........................................................ 257/88
See application file for complete search history.

DISPLAY SUBSTRATE INCLUDING A RETAINING WALL IN A FRAME AREA AND DISPLAY DEVICE HAVING THE SAME

RELATED APPLICATION

This application claims the priority of the Chinese patent application with the application number 202110121161.6 filed on Jan. 28, 2021, and the entire content of the application is incorporated herein by reference.

FIELD

The present disclosure relates to the field of display technologies, and in particular to a display substrate and a display device.

BACKGROUND

With the continuous development of science and technology, users have increasingly higher pursuit of the screen-to-body ratio of the display device (the ratio of the area of the display screen to the area of the front panel of the display device).

In related technical fields, the concept of a full screen has emerged, that is, optical devices such as image collectors in the display device are placed below the display screen to increase the ratio between area of the display screen and the area of front panel of the display device, and the ratio is close to 100%.

SUMMARY

In one aspect, embodiments of the present disclosure provide a display substrate, the display substrate comprising a display area and a frame area, the display substrate comprising: a substrate; a plurality of sub-pixels on a side of the substrate, the plurality of sub-pixels being configured to emit light in the display area; an encapsulation layer on a side of the plurality of sub-pixels away from the substrate; and a retaining wall in the frame area, wherein the retaining wall is between the encapsulation layer and the substrate and comprises a first sub-retaining wall, a second sub-retaining wall, and a transition area between the first sub-retaining wall and the second sub-retaining wall, wherein the second sub-retaining wall is on a side of the first sub-retaining wall away from the display area, the vertical distance between the end of the second sub-retaining wall away from the substrate and the substrate is greater than the vertical distance between the end of the first sub-retaining wall away from the substrate and the substrate, the vertical distance between the end of the first sub-retaining wall away from the substrate and the substrate is greater than the vertical distance between the end of the transition area away from the substrate and the substrate; and wherein, the retaining wall comprises at least one layer provided in the same layer, the at least one layer provided in the same layer continuously extends across the first sub-retaining wall, the second sub-retaining wall and the transition area.

In some embodiments, the display area comprises a first display area and a second display area, and the plurality of sub-pixels comprises a plurality of first sub-pixels and a plurality of second sub-pixels, wherein the plurality of first sub-pixels are in the first display area, and each first sub-pixel of the plurality of first sub-pixels comprises a first pixel drive circuit and a first light-emitting device electrically connected to the first pixel drive circuit; each second sub-pixel of the plurality of second sub-pixels comprises a second pixel drive circuit and a second light-emitting device electrically connected to the second pixel drive circuit, the second light-emitting device is in the second display area, the plurality of second sub-pixels comprises a plurality of second pixel drive circuits, at least one second pixel drive circuit of the plurality of second pixel drive circuits is not in the second display area; and the first sub-retaining wall is on a side of the at least one second pixel drive circuit away from the display area.

In some embodiments, the display substrate comprises a first flat layer, the at least one layer provided in the same layer comprises a first layer provided in the same layer, and wherein, the first layer provided in the same layer is provided in the same layer as the first flat layer.

In some embodiments, the display substrate further comprises a second flat layer, a third flat layer, and a fourth flat layer sequentially arranged on the first flat layer, the at least one layer provided in the same layer also comprise a second layer provided in the same layer, a third layer provided in the same layer, and a fourth layer provided in the same layer sequentially arranged on the first layer provided in the same layer, and wherein, the second layer provided in the same layer is provided in the same layer as the second flat layer, the third layer provided in the same layer is provided in the same layer as the third flat layer, and the fourth layer provided in the same layer is provided in the same layer as the fourth flat layer.

In some embodiments, the display substrate further comprises a fifth flat layer on the fourth flat layer, the second sub-retaining wall further comprises a fifth flat layer on the fourth layer provided in the same layer, and wherein, the fifth layer comprised in the second sub-retaining wall is provided in the same layer as the fifth flat layer, and the orthographic projection of the fifth layer comprised in the second sub-retaining wall on the substrate does not overlap with the orthographic projections of the transition area and the first sub-retaining wall on the substrate.

In some embodiments, the display substrate further comprises a pixel defining layer on the fifth flat layer, and the second sub-retaining wall further comprises a sixth layer on the fifth layer, the first sub-retaining wall further comprises a fifth layer on the fourth layer provided in the same layer, and wherein, the sixth layer comprised in the second sub-retaining wall, the fifth layer comprised in the first sub-retaining wall, and the pixel defining layer are provided in the same layer, and the orthographic projection of the sixth layer comprised in the second sub-retaining wall on the substrate and the orthographic projection of the fifth layer comprised in the first sub-retaining wall on the substrate do not overlap with the orthographic projection of the transition area on the substrate.

In some embodiments, the display substrate further comprises at least one conduction layer, wherein the second pixel drive circuit in the frame area is electrically connected to the corresponding second light emitting device through the at least one conduction layer, and the display substrate further comprises: a flat layer between the at least one conduction layer and the second pixel drive circuit; and a flat layer between the at least one conduction layer and the second light emitting device.

In some embodiments, the at least one conduction layer comprises a plurality of conduction layers, and the display substrate further comprises a flat layer between two adjacent conduction layers among the plurality of conduction layers.

In some embodiments, the plurality of conduction layers comprises a first conduction layer, a second conduction layer, and a third conduction layer, and the display substrate comprises the first flat layer, the second flat layer, the third flat layer, the fourth flat layer and the fifth flat layer sequentially arranged on the substrate; the second pixel drive circuit is between the substrate and the first flat layer; the first conduction layer is between the second flat layer and the third flat layer; the second conduction layer is between the third flat layer and the fourth flat layer; the third conduction layer is between the fourth flat layer and the fifth flat layer; and the second light emitting device is on a side of the fifth flat layer away from the substrate.

In some embodiments, the at least one conduction layer is light-transmissive.

In some embodiments, the display substrate further comprises: a barrier layer; the first end of the barrier layer extends into the first sub-retaining wall, and the second end of the barrier layer extends between the two flat layers comprised in the display substrate.

In some embodiments, the first end of the barrier layer is between the second layer provided in the same layer and the third layer provided in the same layer, and the second end of the barrier layer is between the second flat layer and the third flat layer.

In some embodiments, the first end of the barrier layer is between the third layer provided in the same layer and the fourth layer provided in the same layer, and the second end of the barrier layer is between the third flat layer and the fourth flat layer.

In some embodiments, the first end of the barrier layer is between the fourth layer provided in the same layer and the fifth layer comprised in the first sub-retaining wall, and the second end of the barrier layer is between the fourth flat layer and the fifth flat layer.

In some embodiments, the barrier layer is provided in the same layer as one of the first conduction layer, the second conduction layer, and the third conduction layer, and the barrier layer is not electrically connected to the first conduction layer, the second conduction layer or the third conduction layer.

In some embodiments, the encapsulation layer comprises: a first inorganic layer on the retaining wall; an organic layer on a side of the first inorganic layer away from the substrate; and a second inorganic layer on a side of the organic layer away from the substrate.

In some embodiments, at least one second pixel drive circuit of the plurality of second pixel drive circuits is in the frame area.

In some embodiments, the organic layer is prepared by a printing process.

In another aspect, embodiments of the present disclosure provide a display device comprising: the above-mentioned display substrate; and the optical device on the opposite side of the light-emitting side of the display substrate, wherein, at least part of the second display area of the display substrate is in the field of view of the optical device.

In some embodiments, the frame area of the display substrate comprises a binding area, the display device further comprises: a touch structure on the light-emitting side of the display substrate, the orthographic projection of the touch structure on the substrate at least partially overlaps with the orthographic projection of the display area on the substrate; a touch driving chip in the binding area; and a plurality of signal transmission lines electrically connected to the touch structure and the touch driving chip, the orthographic projections of the plurality of signal transmission lines on the substrate at least partially overlaps with the orthographic projection of the transition area on the substrate.

BRIEF DESCRIPTION OF THE DRAWINGS

In order to explain the technical solutions of the present disclosure more clearly, the following will briefly introduce the drawings that need to be used in some embodiments of the present disclosure. Obviously, the drawings in the following description are merely drawings for some embodiments of the present disclosure. For those of ordinary skill in the art, other drawings can also be obtained based on these drawings. In addition, the drawings in the following description can be regarded as schematic diagrams, and are not intended to limit the actual sizes of the products involved in the embodiments of the present disclosure.

DETAILED DESCRIPTION

Figure 1:
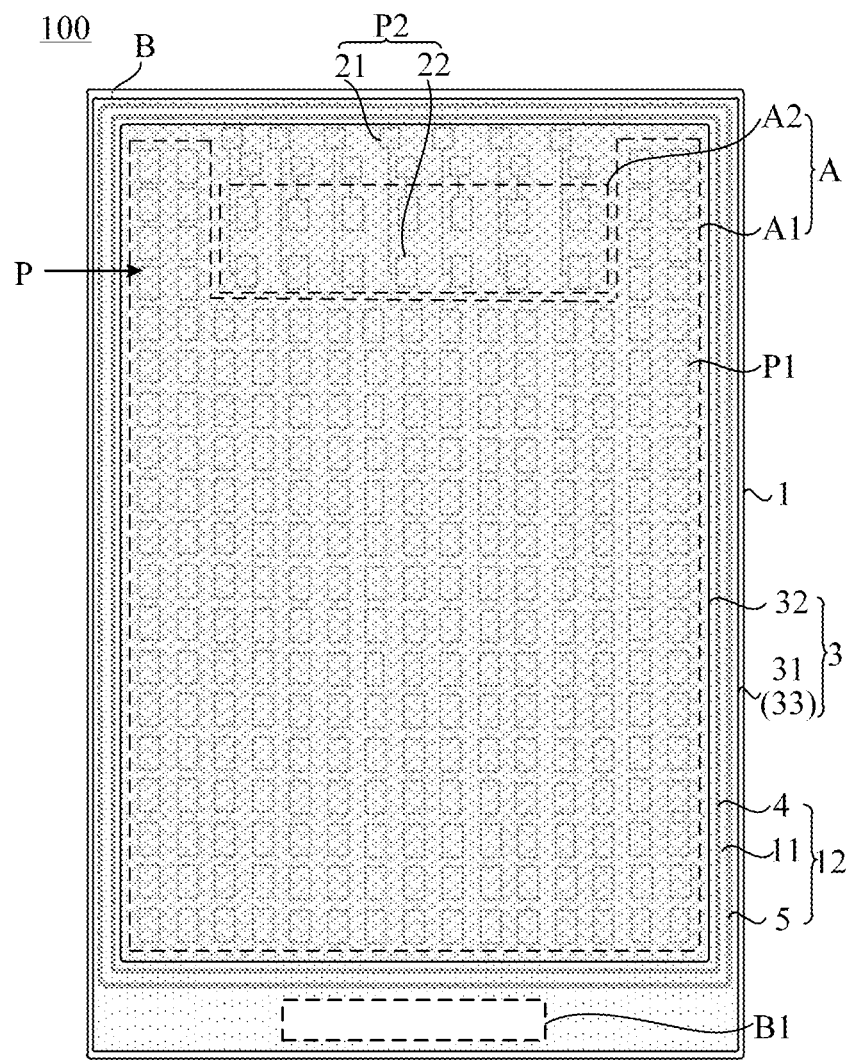
FIG. 1 is a structural diagram of a display substrate according to some embodiments of the present disclosure.

The technical solutions in some embodiments of the present disclosure will be clearly and completely described below in conjunction with the accompanying drawings. Obviously, the described embodiments are only a part of the embodiments of the present disclosure, rather than all the embodiments. Based on the embodiments provided in the present disclosure, all other embodiments obtained by those of ordinary skill in the art fall within the protection scope of the present disclosure.

Unless the context requires otherwise, throughout the specification and claims, the term "comprising" is interpreted as an open and inclusive meaning, that is, "comprising, but not limited to". In the description of the specification, the terms "one embodiment", "some embodiments", "exemplary embodiments", "examples" or "some examples" are intended to indicate that specific features, structures, materials or characteristics related to the embodiment or example are comprised in at least one embodiment or example of the present disclosure. The schematic representations of the above terms do not necessarily refer to the same embodiment or example. In addition, the specific features, structures, materials, or characteristics described may be comprised in any one or more embodiments or examples in any suitable manner.

Hereinafter, the terms "first" and "second" are only used for descriptive purposes, and cannot be understood as indicating or implying relative importance or implicitly indicating the number of indicated technical features. Thus, the features defined with "first" and "second" may explicitly or implicitly comprise one or more of these features. In the description of the embodiments of the present disclosure, unless otherwise specified, "a plurality of" means two or more.

"A and/or B" comprises the following three combinations: A only, B only, and a combination of A and B.

As used herein, depending on the context, the term "if" is optionally interpreted as meaning "when" or "at the time when" or "in response to a determination of" or "in response to a detection of". Similarly, depending on the context, the phrase "if it is determined . . . " or "if [the stated condition or event] is detected" is optionally interpreted to mean "when determining . . . " or "in response to determining . . . " or "when [the stated condition or event] is detected" or "in response to detecting [the stated condition or event]".

The use of "applicable to" or "configured to" in this document means an open and inclusive language, which does not exclude devices applicable to or configured to perform additional tasks or steps.

In addition, the use of "based on" means openness and inclusiveness, because processes, steps, calculations or other actions "based on" one or more of the stated conditions or values may be based on additional conditions or exceed the stated values in practice.

As used herein, "about" or "approximately" comprises the stated value as well as the average value within the acceptable deviation range of the specified value, where the acceptable deviation range is determined by those of ordinary skill in the art by taking the measurement and the error associated with the measurement of a specific quantity (i.e., the limitations of the measurement system) into account.

The exemplary embodiments are described herein with reference to cross-sectional views and/or plan views as idealized exemplary drawings. In the drawings, the thickness of layers and regions are exaggerated for clarity. Therefore, variations in the shape with respect to the drawings due to, for example, manufacturing technology and/or tolerances can be envisaged. Therefore, the exemplary embodiments should not be construed as being limited to the shape of the area shown herein, but comprise shape deviations due to, for example, manufacturing. For example, the etched area shown as a rectangle will generally have curved features. Therefore, the areas shown in the drawings are schematic in nature, and their shapes are not intended to show the actual shape of the area of the device, and are not intended to limit the scope of the exemplary embodiments.

Display devices generally comprise Liquid Crystal Display (LCD), Organic Light Emitting Diode (OLED) display devices, and Quantum Dot Light Emitting Diodes (QLED) display devices. Taking into account the structure and display principle of the LCD, it is difficult for external light to pass through the back light module, so it is difficult to arrange optical devices such as image collectors under the display. The external light can pass through the gap between two adjacent sub-pixels in the OLED display device (or QLED display device), and can be emitted from the light-emitting side of the OLED display device (or QLED display device) to the non-light-emitting side of the OLED display device (or QLED display device). Therefore, OLED display devices (or QLED display devices) are currently mainly used to achieve a full-screen design. In related technologies, the concept of a full screen has emerged, that is, optical devices such as image collectors in the display device are below the display screen to increase the ratio between area of the display screen and the area of front panel of the display device, and the ratio is close to 100%.

Figure 6:
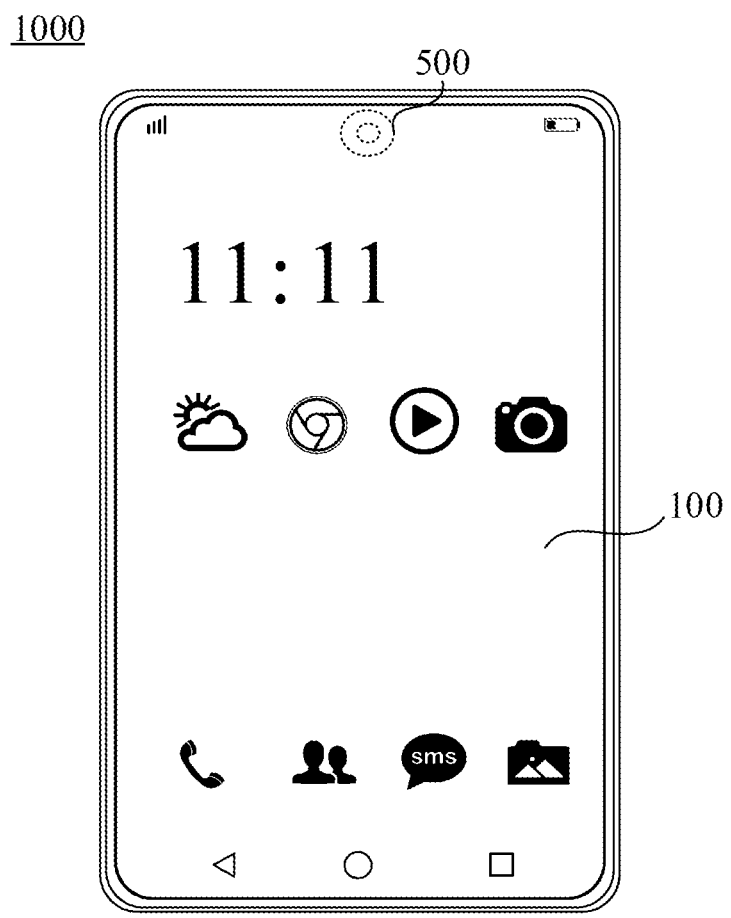
FIG. 6 is a structural diagram of a display device according to some embodiments of the present disclosure.
Figure 7:
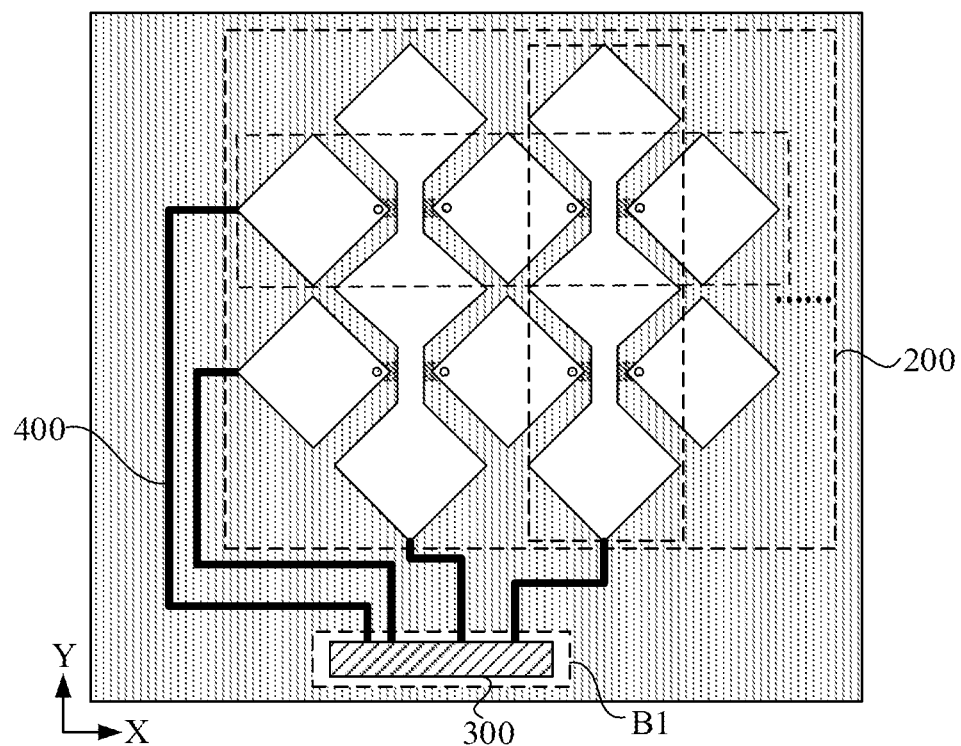
FIG. 7 is a structural diagram of another display device according to some embodiments of the present disclosure.
Figure 8:
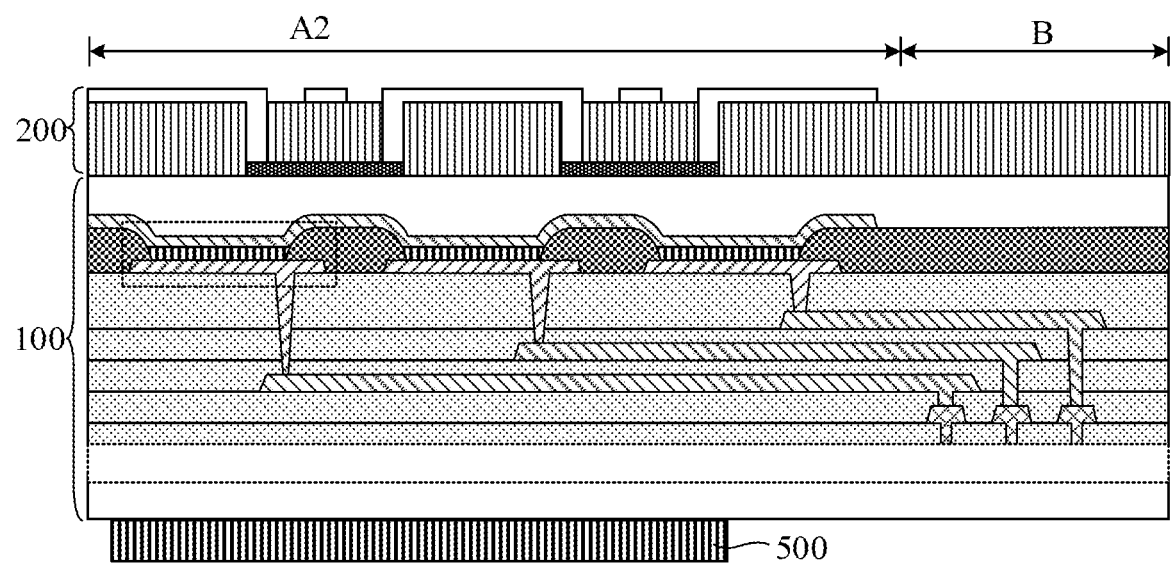
FIG. 8 is a partial structure diagram of a display device according to some embodiments of the present disclosure.

Some embodiments of the present disclosure provide a display device 1000. As shown in FIGS. 6 to 8, the display device 1000 comprises a display substrate 100 and an optical device 500. In some embodiments, the display device 1000 further comprises a touch structure 200, a touch driving chip 300, and a plurality of signal transmission lines 400.

There are many types of the above-mentioned optical device 500, which may be selected and set according to actual needs. In some examples, the above-mentioned optical device 500 may be, for example, a camera, an infrared receiver, or an infrared transmitter etc.

In some examples, as shown in FIG. 1, the above-mentioned display substrate 100 has a display area A and a frame area B. The portion of the display substrate 100 located in the display area A can perform image display.

It should be noted that, the present disclosure does not limit the location of the frame area B. The frame area B can be located on one side, two sides, or three sides of the display area A. Of course, the frame area B can also be located on the periphery of the display area A.

In some examples, as shown in FIG. 1, the display area A comprises a first display area A1 and a second display area A2. The area of the first display area A1 may be larger than the area of the second display area A2, for example.

Here, the number of the second display area A2 may be one or multiple, and may be selected and set according to actual needs.

The above-mentioned positional relationship between the first display area A1 and the second display area A2 comprises multiple types, which may be selected and set according to actual needs.

Exemplarily, the first display area A1 may be located at the periphery of the second display area A2, that is, the first display area A1 surrounds the second display area A2. At this time, the shape of the second display area A2 may be, for example, a circle, an ellipse, or a rectangle.

Exemplarily, as shown in FIG. 1, the second display area A2 is located beside the first display area A1, that is, a part of the boundary of the second display area A2 overlaps with a part of the boundary of the first display area A1. At this time, the shape of the second display area A2 may be, for example, a rectangle, a rounded rectangle, a drop shape, or a semicircle.

In some examples, as shown in FIG. 1, the frame area B comprises at least one binding area B1. There may be a gap between the display area A and the binding area B1.

In the following, taking the optical device 500 is a camera, the number of the second display area A2 is one, the number of the binding area B1 is one, and the second display area A2 is located next to the first display area A1 as an example, the structure of the display device 1000 is schematically illustrated.

In some examples, as shown in FIG. 8, the optical device 500 is on the opposite side of the light-emitting side of the display substrate 100, and at least part of the second display area A2 of the display substrate 100 may be located in the field of view of the optical device 500. The external light can pass through the display substrate 100 and enter the optical device 500, so that the optical device 500 can work.

In some examples, as shown in FIG. 8, the above-mentioned touch structure 200 may be on the light-emitting side of the display substrate 100, and the orthographic projection of the touch structure 200 on the substrate of the display substrate 100 at least partially overlaps with the orthographic projection of the display area A on the substrate of the display substrate 100. In some embodiments, the optical device 500 and the touch structure 200 are located on opposite sides of the display substrate 100.

In this way, the user can use the touch structure 200 to control the image to be displayed on the display substrate 100, so that the display device 1000 has both a display function and a touch function.

In some examples, as shown in FIG. 7, the touch driving chip 300 may be in the binding area B1 and located on the same side of the display substrate 100 as the touch structure 200. The touch driving chip 300 may transmit touch driving signals to the touch structure 200, and may also receive touch sensing signals transmitted by the touch structure 200, so that the user can realize a control of the image to be displayed on the display substrate 100 through the touch structure 200.

In some examples, as shown in FIG. 7, multiple signal transmission lines 400 are located on the same side of the display substrate 100 as the touch structure 200 and the touch driving chip 300. One end of each signal transmission line 400 extends into the display area A and is electrically connected to the touch structure 200, and the other end extends into the binding area B1 and is electrically connected to the touch driving chip 300. In this way, the touch driving chip 300 and the touch structure 200 may realize the transmission of touch driving signals and touch sensing signals through the signal transmission line 400.

In some embodiments, since the touch structure 200 is located in the display area A and the touch driving chip 300 is located in the binding area B1, this also means that the signal transmission line 400 needs to pass through the frame area B to realize electrical connection between the touch structure 200 and the touch driving chip 300.

The structure of the display substrate 100 provided by some embodiments of the present disclosure will be schematically described below with reference to the accompanying drawings.

In some examples, as shown in FIG. 1, the display substrate 100 may comprise: a substrate 1.

There are many types of the above-mentioned substrate 1, which may be selected and set according to actual needs.

Exemplarily, the aforementioned substrate 1 may be a rigid substrate. The rigid substrate may be a glass substrate or a Polymethyl methacrylate (PMMA) substrate or the like.

Exemplarily, the aforementioned substrate 1 may be a flexible substrate. The flexible substrate may be a Polyethylene terephthalate (PET) substrate, a Polyethylene naphthalate two formic acid glycol ester (PEN) substrate, or a Polyimide (PI) substrate, etc.

In some examples, as shown in FIG. 1, the display substrate 100 may further comprise a plurality of sub-pixels P on one side of the substrate 1, and the plurality of sub-pixels P are configured to emit light in the display area A. The plurality of sub-pixels P comprise a plurality of first sub-pixels P1 and a plurality of second sub-pixels P2.

Figure 2:
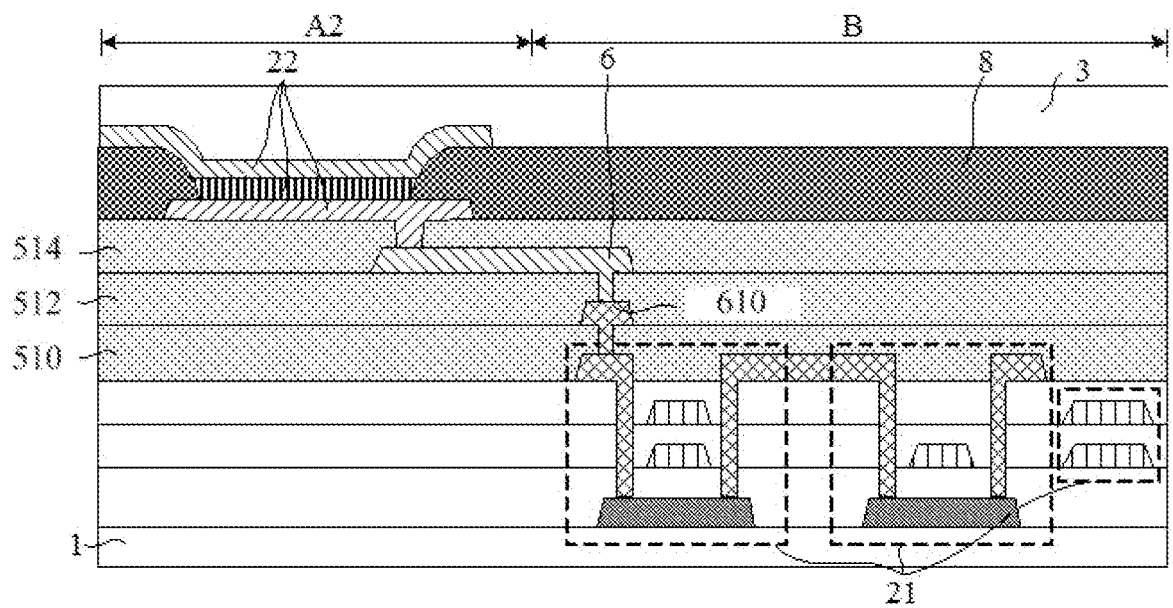
FIG. 2 is a partial structure diagram of a display substrate according to some embodiments of the present disclosure.

Exemplarily, the plurality of first sub-pixels P1 are located in the first display area A1, and each first sub-pixel P1 of the plurality of first sub-pixels comprises a first pixel drive circuit and a first light-emitting device. The first light-emitting device may be located on a side of the first pixel drive circuit away from the substrate 1 and electrically connected to the first pixel drive circuit. The first pixel drive circuit can provide a driving voltage to the first light-emitting device to control the light-emitting state of the first light-emitting device. As shown in FIGS. 1 and 2, each second sub-pixel P2 comprises a second pixel drive circuit 21 and a second light emitting device 22. The second light emitting device 22 may be located on a side of the second pixel drive circuit 21 away from the substrate 1 and electrically connected to the second pixel drive circuit 21. The second pixel drive circuit 21 can provide a driving voltage to the second light-emitting device 22 to control the light-emitting state of the second light-emitting device 22. The plurality of first sub-pixels P1 and the plurality of second sub-pixels P2 may cooperate with each other, so that the display substrate 100 can perform image display.

In some embodiments, the structure of the first pixel drive circuit comprised in the first sub-pixel P1 may be the same as or similar to the structure of the second pixel drive circuit 21 comprised in the second sub-pixel P2. The structure of the first light-emitting device comprised in the first sub-pixel P1 may be the same as or similar to the structure of the second light-emitting device 22 comprised in the second sub-pixel P2.

It should be noted that, the structure of the second pixel drive circuit 21 may comprise multiple types, which are not limited in the present disclosure. For example, the structure of the second pixel drive circuit 21 may be a structure such as "6T1C", "7T1C", "6T2C" or "7T2C". Here, "T" represents thin film transistors, the number before "T" represents the number of thin film transistors, "C" represents storage capacitors, and the number before "C" represents the number of storage capacitors.

For example, the thin film transistor comprised in the second pixel drive circuit 21 may be a thin film transistor with a bottom gate structure. For another example, the thin film transistor comprised in the second pixel drive circuit 21 may be a thin film transistor with a top gate structure.

The above-mentioned second light emitting device 22 may be, for example, an Organic Light Emitting Diode (OLED) device or a Quantum Dot Light Emitting Diodes (QLED) device. The light emitting mode of the second light emitting device 22 may be top emitting light or bottom emitting light, for example.

The present disclosure is schematically illustrated taking the thin film transistor comprised in the second pixel drive circuit 21 is a thin film transistor with a top gate structure, the second light emitting device 22 is an OLED light emitting device, and the light emitting mode of the second light emitting device 22 is top emitting light as an example.

Exemplarily, as shown in FIG. 2, the first pixel drive circuit in the first sub-pixel P1 may be electrically connected to the corresponding first light-emitting device through the connecting portion, and the second pixel drive circuit 21 in the second sub-pixel P2 may be electrically connected to the corresponding second light emitting device 22 through the connecting portion. This helps to reduce the difficulty of wiring.

Exemplarily, as shown in FIG. 1, the plurality of first sub-pixels P1 comprised in the display substrate 100 are located in the first display area A1. Among the plurality of second sub-pixels P2 comprised in the display substrate 100, each second light-emitting device 22 is located in the second display area A2, the plurality of second sub-pixels P2 comprise a plurality of second pixel drive circuits 21, and at least one second pixel drive circuit 21 of the plurality of second pixel drive circuits is not located in the second display area A2, such as in the first display area A1, such as in the frame area B.

For example, only one second pixel drive circuit 21 is located in the frame area B, or the second pixel drive circuit 21 in each second sub-pixel P2 is located in the frame area B. In the case where the second pixel drive circuits 21 in the plurality of second sub-pixels P2 are in the frame area B, the plurality of second pixel drive circuits 21 may be on the side of the frame area B close to the second display area A2, and arranged in sequence or in an array.

Since the second pixel drive circuit 21 is mainly composed of metal lines, the metal lines can form a strong blocking effect on light. By disposing at least one second pixel drive circuit 21 not in the second display area A2 (such as in the first display area A1, such as in the frame area B), the number of the second pixel drive circuit 21 in the second display area A2 may be reduced. In this way, during the process of external light passes through the portion of the display substrate 100 located in the second display area A2 and enters the optical device 500 so that the optical device 500 is working, the shielding of the external light may be reduced, the ratio of the light transmitted through the display substrate 100 is increased, and the working performance of the optical device 500 is improved.

On this basis, the present disclosure may increase the density of the second light emitting device 22 in the second display area A2 (for example, it may be the same as the density of the first sub-pixel P1 in the first display area A1), that is, increase the Pixels Per Inch (PPI for short) of the portion of the display substrate 100 in the second display area A2, and is further beneficial to improving the overall display effect of the display substrate 100.

In some embodiments, during the process of the optical device 500 is not working, the part of the display substrate 100 located in the display area A can perform image display; during the process of the optical device 500 is working (for example, the user is taking a selfie), the part of the display substrate 100 located in the second display area A2 may present a black picture, and the part of the display substrate 100 located in the first display area A1 may present a picture of the user taking a selfie, which clearly shows the location of the optical device 500.

Figure 3:
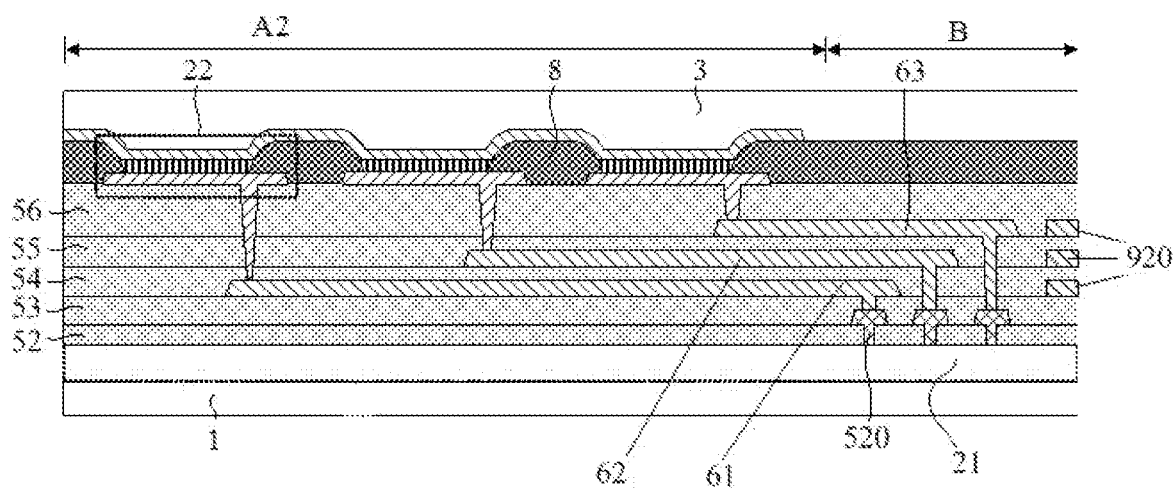
FIG. 3 is a partial structure diagram of another display substrate according to some embodiments of the present disclosure.

In some examples, as shown in FIGS. 1 to 3, the display substrate 100 may further comprise: an encapsulation layer 3 on the side of the plurality of sub-pixels P away from the substrate 1.

Exemplarily, the orthographic projections of the plurality of first sub-pixels P1 and the plurality of second sub-pixels P2 on the substrate 1 are located within the orthographic projection of the encapsulation layer 3 on the substrate 1, so that the encapsulation layer 3 may be used to the first light-emitting device comprised in the first sub-pixel P1 and the second light-emitting device 22 comprised in the second sub-pixel P2 to form a good encapsulation effect, preventing external water vapor and/or oxygen from corroding the first light-emitting device comprised in the first sub-pixel P1 and the second light-emitting device 22 comprised in the second sub-pixel P2, which affects the luminous efficiency and service life.

Figure 4:
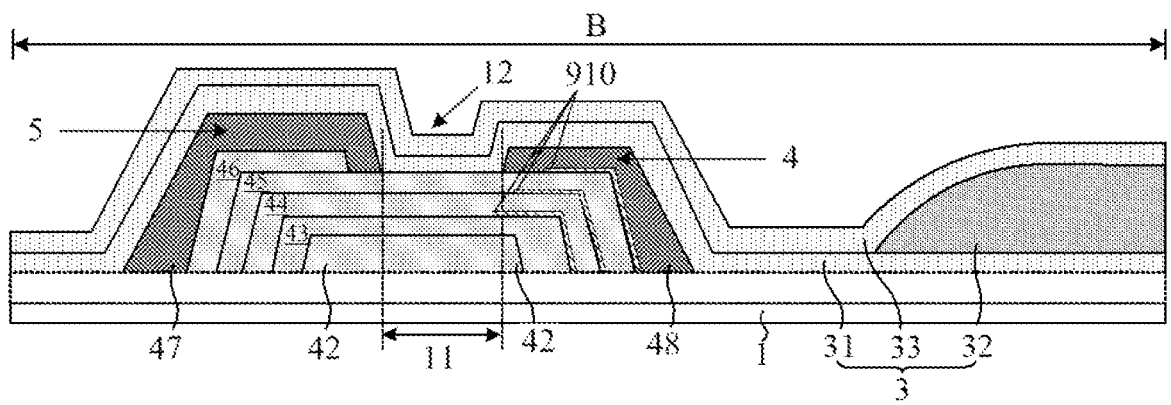
FIG. 4 is a partial structure diagram of still another display substrate according to some embodiments of the present disclosure.
Figure 5:
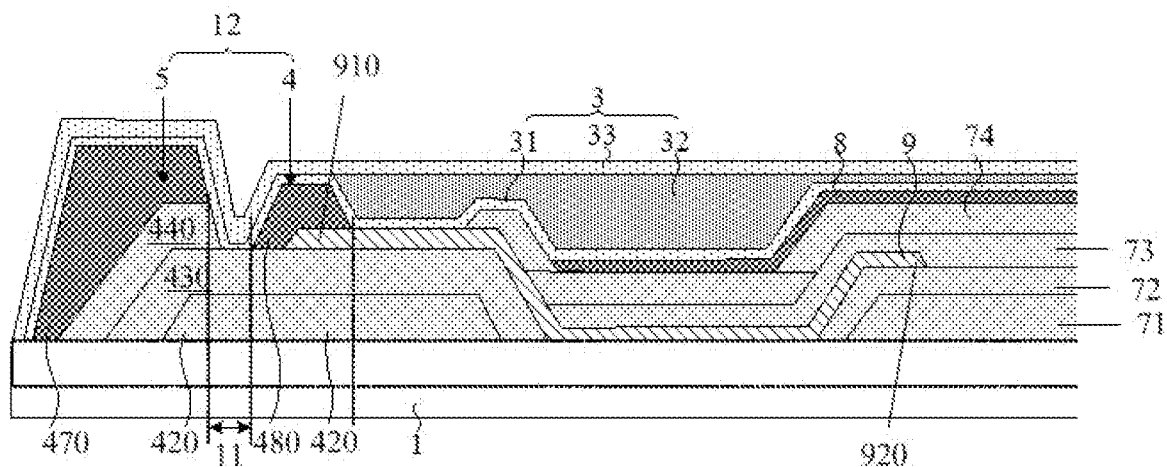
FIG. 5 is a partial structure diagram of another display substrate according to some embodiments of the present disclosure.

Exemplarily, as shown in FIGS. 1, 4, and 5, the above-mentioned encapsulation layer 3 may comprise: a first inorganic layer 31, an organic layer 32 on the side of the first inorganic layer 31 away from the substrate 1, and a second inorganic layer 33 on the side of the organic layer 32 away from the substrate 1.

For example, the first inorganic layer 31 may be prepared by using an inorganic insulating material and using a deposition process. The second inorganic material 33 may be prepared by using an inorganic insulating material and using a deposition process. The organic layer 32 may be prepared by using organic insulating materials and using a printing process (for example, printing inkjet).

In some examples, as shown in FIG. 1, FIG. 4, and FIG. 5, the display substrate 100 may further comprise: a retaining wall 12 located in the frame area B. The retaining wall 12 is located between the encapsulation layer 3 and the substrate 1 and comprises a first sub-retaining wall 4, a second sub-retaining wall 5, and a transition area 11 between the first sub-retaining wall 4 and the second sub-retaining wall 5. The first sub-retaining wall 4 and the second sub-retaining wall 5 are used to block the encapsulation layer 3 and the flow of a part of the fluid during the preparation process of the encapsulation layer 3.

Exemplarily, the second sub-retaining wall 5 is located on the side of the first sub-retaining wall 4 away from the display area A.

Exemplarily, the first sub-retaining wall 4 is located on the side of the at least one second pixel drive circuit 21 in the frame area B away from the display area A. That is, in the display substrate 100, the second pixel drive circuit 21, the first sub-retaining wall 4, the transition area 11, and the second sub-retaining wall 5 located in the frame area B are sequentially away from the display area A.

Exemplarily, as shown in FIG. 1, the first sub-retaining wall 4 and the second sub-retaining wall 5 may be arranged on the edge of the display substrate 100 and arranged in a ring shape. The first sub-retaining wall 4 surrounds the plurality of first sub-pixels P1 and the plurality of second sub-pixels P2, and the second sub-retaining wall 5 surrounds the first sub-retaining wall 4.

In some embodiments, the first inorganic layer 31 may, for example, cover the first sub-retaining wall 4 and the second sub-retaining wall 5 while covering the plurality of first sub-pixels P1 and the plurality of second sub-pixels P2, in order to form a relatively good encapsulation effect.

The above-mentioned organic layer 32 may, for example, be located within the range defined by the first sub-retaining wall 4, that is, the orthographic projection of the organic layer 32 on the substrate 1 is located within the orthographic projection of the first sub-retaining wall 4 on the substrate 1. This also means that the first sub-retaining wall 4 can block the organic layer 32 in the encapsulation layer 3 and the flow of a part of the fluid during the preparation process of the organic layer 32 to ensure a good encapsulation effect.

Exemplarily, the vertical distance between the end of the second sub-retaining wall 5 away from the substrate 1 and the substrate 1 is greater than the vertical distance between the end of the first sub-retaining wall 4 away from the substrate 1 and the substrate 1, and the vertical distance between the end of the first sub-retaining wall 4 away from the substrate 1 and the substrate 1 is greater than the vertical distance between the end of the transition area 11 away from the substrate 1 and the substrate 1.

Here, due to the process of preparing and forming the organic layer 32, there will inevitably be certain errors, which may prevent the first sub-retaining wall 4 from forming a good block of the organic layer 32 and the flow of a part of the fluid during the preparation process of the organic layer 32. In some embodiments of the present disclosure, by setting the vertical distance between the end of the second sub-retaining wall 5 away from the substrate and the substrate 1 to be greater than the vertical distance between the end of the first sub-retaining wall 4 away from the substrate and the substrate 1, the second sub-retaining wall 5 can be used to further block the organic layer 32 and the flow of a part of the fluid during the preparation process of the organic layer 32, thereby improving the blocking effect of the organic layer 32 and the flow of a part of the fluid during the preparation process of the organic layer 32, in turn improving the encapsulation effect of the encapsulation layer 3.

In some embodiments, the above-mentioned second inorganic layer 33 may, for example, cover the organic layer 32 and the first inorganic layer 31, and while covering the first inorganic layer 31, it also covers the first sub-retaining wall 4 and the second sub-retaining wall 5, in order to form a relatively good encapsulation effect.

In some embodiments, due to the orthographic projection of the organic layer 32 on the substrate 1 is located within the orthographic projection of the first sub-retaining wall 4 on the substrate 1, and the first inorganic layer 31 and the second inorganic layer 33 formed an overlay to the first sub-retaining wall 4 and the second sub-retaining wall 5, therefore, the part of the first inorganic layer 31 and the second inorganic layer 33 that exceeds the organic layer 32 may form a contact.

In related art, the frame area of the display substrate will be provided with two sub-retaining walls (there is a gap or step difference between the two sub-retaining walls), and the sub-retaining wall is generally provided in the same layer with an insulating layer in the display area (for example, pixel definition layer). However, in the case of the display substrate is applied to the under-screen camera display device, and at least one second pixel drive circuit 21 electrically connected to the second light-emitting device in the second display area is set be not located in the second display area A2 (such as in the first display area A1, such as in the frame area B), the second light-emitting device and the second pixel drive circuit need to be electrically connected through wires, and an insulating layer between the second light-emitting device and the wires and between the wires and the second pixel drive circuit is required. On the one hand, this will increase the thickness of the portion of the display substrate located in the display area, and it is difficult for the retaining wall located in the frame area to form a good barrier to the organic layer in the encapsulation layer, thereby adversely affecting the encapsulation effect of the encapsulation layer. On the other hand, if the thickness of the sub-retaining wall is increased, the step difference between the transition area 11 and the first sub-retaining wall 4 or the second sub-retaining wall 5 will be too large, which increases the complexity of the patterning process and reduces the product yield.

Figure 9:
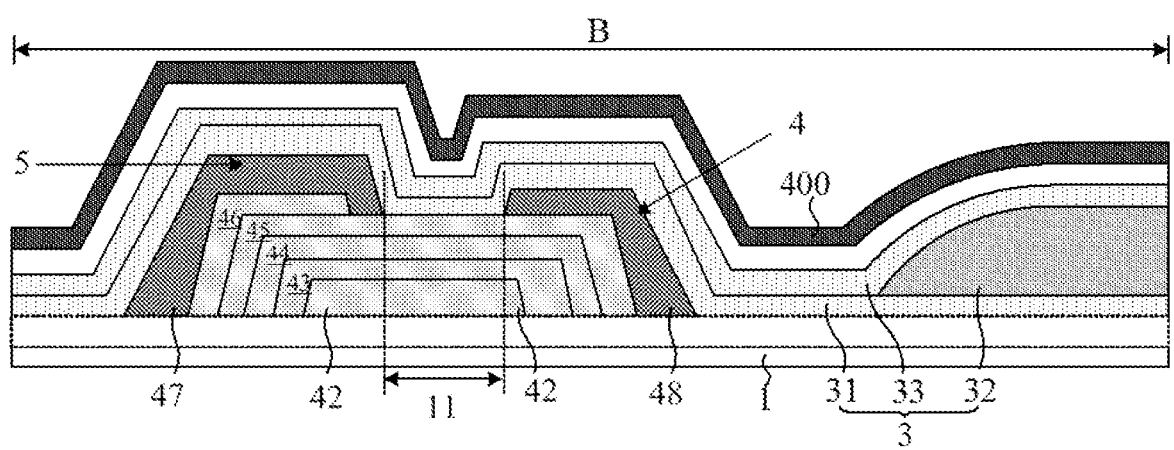
FIG. 9 is a partial structure diagram of a display device according to some embodiments of the present disclosure.

In some embodiments, as shown in FIGS. 3, 4, and 9, the retaining wall 12 comprises at least one layer provided in the same layer 42, 43, 44, and 45, and at least one layer provided in the same layer 42, 43, 44, and 45 extends continuously across the first sub-retaining wall 4, the second sub-retaining wall 5 and the transition area 11. For example, as shown in FIGS. 3-4, the display substrate 100 comprises a first flat layer 52, at least one layer provided in the same layer comprises the first layer provided in the same layer 42, and the first layer provided in the same layer 42 is provided in the same layer with the first flat layer 52. The retaining wall 12 comprises at least one layer provided in the same layer 42, 43, 44, and 45, and at least one layer provided in the same layer 42, 43, 44, and 45 extends continuously across the first sub-retaining wall 4, the second sub-retaining wall 5 and the transition area 11, which may reduce the step difference between the first sub-retaining wall 4 and the transition area 11, and reduce the step difference between the second sub-retaining wall 5 and the transition area 11.

It should be understood that in the present disclosure, the term "provided in a same layer" refers to being formed by the a same film forming process and a same patterning process, and a layer of the term "provided in a same layer" refers to a layer being formed by the a same film forming process and a same patterning process. Depending on the specific pattern, the same patterning process may comprise multiple exposure, development or etching processes, and the specific patterns in the layer structure formed by the same patterning process may be continuous or discontinuous, and these specific patterns may also be at different heights or of different thicknesses. For example, layer A and layer B being "provided in a same layer" refers to that the layer A and layer B are formed by the same film forming process and the same patterning process.

In some embodiments, the display substrate 100 further comprises a second flat layer 53, a third flat layer 54, and a fourth flat layer 55 sequentially arranged on the first flat layer 52, the at least one layer provided in the same layer also comprise a second layer provided in the same layer 43, a third layer provided in the same layer 44, and a fourth layer provided in the same layer 45 sequentially arranged on the first layer provided in the same layer 42. The second layer provided in the same layer 43 is provided in the same layer as the second flat layer 53, the third layer provided in the same layer 44 is provided in the same layer as the third flat layer 54, and the fourth layer provided in the same layer 45 is provided in the same layer as the fourth flat layer 55.

By arranging multiple layers provided in the same layer in the first sub-retaining wall 4 and the second sub-retaining wall 5, the thickness of the first sub-retaining wall 4 and the second sub-retaining wall 5 may be effectively increased, and the vertical distance between the end of the first sub-retaining wall 4 away from the substrate 1 and the substrate 1 may be increased, the vertical distance between the end of the second sub-retaining wall 5 away from the substrate 1 and the substrate 1 may be increased, in turn helps to ensure the blocking and leveling effects of the organic layer 32 in the encapsulation layer 3 and the flow of a part of the fluid during the preparation process of the organic layer 32, and a good encapsulation effect of the encapsulation layer 3 is ensured.

In some embodiments, the display substrate 100 further comprises a fifth flat layer 56 on the fourth flat layer 55, the second sub-retaining wall 5 further comprises a fifth layer 46 on the fourth layer provided in the same layer 45, and the fifth layer 46 comprised in the second sub-retaining wall 5 and the fifth flat layer 56 are provided in the same layer, and the orthographic projection of the fifth layer 46 comprised in the second sub-retaining wall 5 on the substrate does not overlap with the orthographic projections of the transition area 11 and the first sub-retaining walls 4 on the substrate 1.

In some embodiments, the display substrate 100 further comprises a pixel defining layer 8 on the fifth flat layer 56, the second sub-retaining wall 5 further comprises a sixth layer 47 on the fifth layer 46, the first sub-retaining wall 4 also comprises a fifth layer 48 on the fourth layer provided in the same layer 45, and a sixth layer 47 comprised in the second sub-retaining wall 5, a fifth layer 48 comprised in the first sub-retaining wall 4, and a pixel defining layer 8 are provided in the same layer, and the orthographic projection of the sixth layer 47 comprised in the second sub-retaining wall 5 on the substrate 1 and the orthographic projection of the fifth layer 48 comprised in the first sub-retaining wall 4 on the substrate 1 do not overlap with the orthographic projection of the transition area 11 on the substrate 1. For example, the step difference between the first sub-retaining wall 4 and the transition area 11 is the thickness of the fifth layer 48 comprised in the first sub-retaining wall 4, and the step difference between the second sub-retaining wall 5 and the transition area 11 is the sum of the thicknesses of the fifth layer 46 comprised in the second sub-retaining wall 5 and the sixth layer 47 comprised in the second sub-retaining wall 5. In this way, the thickness of the first sub-retaining wall 4 and the second sub-retaining wall 5 (especially the second sub-retaining wall 5) can be further increased, and the step difference between the first sub-retaining wall 4 and the transition area 11 and the step difference between the second sub-retaining wall 5 and the transition area 11 may be reduced.

In some embodiments, the multiple layers comprised in the first sub-retaining wall 4 and the multiple layers comprised in the second sub-retaining wall 5 can be arranged in multiple ways, which may be selected and set according to actual needs. In some embodiments, as shown in FIG. 5, the retaining wall 12 comprises layer 420, 430 provided in the same layer, layer 420, 430 provided in the same layer extends continuously across the first sub-retaining wall 4, the second sub-retaining wall 5 and the transition area 11. The display substrate 100 further comprises flat layers 71, 72, 73, and 74 arranged in sequence. The layer 420 provided in the same layer and the flat layer 71 are provided in the same layer, and the layer 430 provided in the same layer and the flat layer 72 are provided in the same layer. The second sub-retaining wall 5 also comprises a layer 440 on the layer 430 provided in the same layer and a layer 470 on the layer 440. The first sub-retaining wall also comprises a layer 480 on the layer 430 provided in the same layer, and layer 440 comprised in the second sub-retaining wall 5 and the flat layer 73 are provided in the same layer, and the layer 470 comprised in the second sub-retaining wall 5, the layer 480 comprised in the first sub-retaining wall, and the pixel defining layer 8 are provided in the same layer. The orthographic projection of the layer 470 comprised in the second sub-retaining wall 5 on the substrate 1 and the orthographic projection of the layer 480 comprised in the first sub-retaining wall 4 on the substrate 1 do not overlap with the orthographic projection of the transition area 11 on the substrate 1. For example, the step difference between the first sub-retaining wall 4 and transition area 11 is the thickness of the layer 480 comprised in the first sub-retaining wall 4, and the step difference between the second sub-retaining wall 5 and transition area 11 is the sum of the thicknesses of the layer 440 and layer 470 comprised in the second sub-retaining wall 5.

In the case of increasing the vertical distance between the end of the first sub-retaining wall 4 away from the substrate and the substrate 1 and the vertical distance between the end of the second sub-retaining wall 5 away from the substrate and the substrate 1, the sizes of the step difference between the first sub-retaining wall 4 and the transition area 11 and the step difference between the second sub-retaining wall 5 and the transition area 11 in the direction perpendicular to the substrate 1 will also increase. The retaining wall 12 comprises at least one layer provided in the same layer 42, 43, 44, and 45, and at least one layer provided in the same layer 42, 43, 44, and 45 extends continuously across the first sub-retaining wall 4, the second sub-retaining wall 5 and the transition area 11, which may reduce the step difference between the first sub-retaining wall 4 and the transition area 11, and reduce the step difference between the second sub-retaining wall 5 and the transition area 11.

Figure 10:
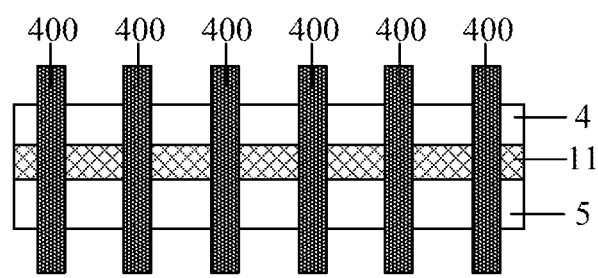
FIG. 10 is a top view of a partial structure diagram of a display device according to some embodiments of the present disclosure.

FIG. 10 schematically shows a top view of the plane shown in FIG. 7. In some examples, as shown in FIGS. 9-10, a plurality of signal transmission lines 400 cross the first sub-retaining wall 4, the transition area 11 and the second sub-retaining wall 5 and enter the display area A from the frame area B. The signal transmission line 400 in the display device 1000 is prepared by a photolithography process. In the process of forming the signal transmission line 400 on the light-emitting side of the display substrate 100 (that is, the side of the encapsulation layer 3 away from the substrate 1), a deposition process may be used to form a conductive material film, and the side of the conductive material film away from the substrate 1 is coated with photoresist, and then the photoresist is exposed and developed, and the conductive material film is patterned to obtain the signal transmission line 400. Since the signal transmission line 400 needs to pass through the frame area B to realize the electrical connection between the touch structure 200 and the touch driving chip 300, the orthographic projection of the signal transmission line 400 on the substrate 1 will at least partially overlaps with the orthographic projection of the transition area 11 between the first sub-retaining wall 4 and the second sub-retaining wall 5 on the substrate 1.

The present invention reduces the step difference between the first sub-retaining wall 4 and the transition area 11 and the step difference between the second sub retaining wall 5 and the transition area 11, in the process of preparing and forming the signal transmission line 400 by photolithography, the thickness of the photoresist in the transition area 11 may be reduced, so that in the process of exposing and developing the photoresist, the photoresist remaining in the transition area 11 may be avoided, and in turn in the process of patterning the conductive material film, the formation of conductive material residues can be avoided, the signal transmission line 400 can be prevented from being short-circuited, and the yield of the display device 1000 may be improved.

In the display substrate 100 provided by some embodiments of the present disclosure, after setting at least one second pixel drive circuit 21 in the plurality of second sub-pixels P2 to be not located in the second display area A2 (such as in the first display area A1, such as in the frame area B), the first sub-retaining wall 4 and the second sub-retaining wall 5 comprising at least one layer provided in the same layer 42, 43, 44, and 45 may be arranged in the frame area B to realize the blocking effect of the encapsulation layer 3 and the flow of a part of the fluid during the preparation process of the encapsulation layer 3 to ensure the encapsulation effect of the encapsulation layer 3.

In addition, with the retaining wall 12 comprising at least one layer provided in the same layer 42, 43, 44, and 45, and at least one layer provided in the same layer 42, 43, 44, and 45 extending continuously across the first sub-retaining wall 4, the second sub-retaining wall 5 and the transition area 11, so that the orthographic projection of the transition area 11 between the first sub-retaining wall 4 and the second sub-retaining wall 5 on the substrate 1 overlaps with the orthographic projection of at least one layer provided in the same layer 42, 43, 44, and 45 on the substrate 1, the step difference between the first sub-retaining wall 4 and the transition area 11 can be efficiently reduced, and the step difference between the second sub-retaining wall 5 and the transition area 11 can be reduced. In this way, when the display substrate 100 is applied to the display device 1000, the remaining conductive material of the signal transmission line 400 may be effectively avoided, thereby avoiding the short circuit of the signal transmission line 400, and improving the yield of the display device 1000.

In some embodiments, as shown in FIG. 2, the display substrate 100 further comprises at least one conduction layer 6. The second pixel drive circuit 21 located in the frame area is electrically connected to the corresponding second light emitting device 22 through the at least one conduction layer 6, and the display substrate 100 further comprises: flat layers 510, 512 between the at least one conduction layer 6 and the second pixel drive circuit 21; and a flat layer 514 between the at least one conduction layer 6 and the second light emitting device 22. That is, the first end of the at least one conduction layer 6 may extend into the frame area B to be electrically connected to the second pixel drive circuit 21 (for example, electrically connected to the second pixel drive circuit 21 through the connecting portion 610), the second end may extend into the second display area A2 to be electrically connected to the corresponding second light-emitting device 22. In this way, an insulating layer is provided between the second pixel drive circuit 21 and the at least one conduction layer 6, and an insulating layer is provided between the at least one conduction layer 6 and the second light emitting device 22, and the flatness and continuity of the conduction layer 6 may be ensured at the same time, so that the second pixel drive circuit 21 located in the frame area B may provide a driving voltage to the corresponding second light-emitting device 22 through the at least one conduction layer 6, thereby controlling the light-emitting state of the corresponding second light-emitting device 22.

In some embodiments, as shown in FIG. 3, the second pixel drive circuit 21 located in the frame area is electrically connected to the corresponding second light emitting device 22 through at least one conduction layer 6 (and an optional connecting portion 520), at least one conduction layer 6 may comprise a plurality of conduction layers, and the display substrate 100 may further comprise a flat layer between two adjacent conduction layers among the plurality of conduction layers. Exemplarily, the at least one conduction layer 6 comprises a first conduction layer 61, a second conduction layer 62, and a third conduction layer 63, and the display substrate 100 comprises a first flat layer 52, a second flat layer 53, the third flat layer 54, the fourth flat layer 55 and the fifth flat layer 56 sequentially arranged on the substrate 1; the second pixel drive circuit 21 is between the substrate 1 and the first flat layer 52; the first conduction layer 61 is between the second flat layer 53 and the third flat layer 54; the second conduction layer 62 is between the third flat layer 54 and the fourth flat layer 55; the third conduction layer 63 is between the fourth flat layer 55 and the fifth flat layer 56; and the second light emitting device 22 is on the side of the fifth flat layer 56 away from the substrate 1.

Exemplarily, the number of conduction layers in the at least one conduction layer 6 may be equal to the number of the second pixel drive circuits 21 located in the frame area B.

For example, the at least one conduction layer 6 may be formed of a conductive material with a relatively high light transmittance, that is, the at least one conduction layer 6 may be light-transmissive. Exemplarily, the material of the conduction layer 6 may comprise Indium Tin Oxide (ITO), Indium Zinc Oxide (IZO), Indium Gallium Zinc Oxide (IGZO), etc. By using at least one conduction layer 6 to connect the second pixel drive circuit 21 in the frame area B and the second light emitting device 22 in the display A, it helps to further improve the light transmittance of the portion of the display substrate 100 located in the second display area A2, and improve the working performance of the optical device 500.

In some embodiments, the number of flat layers may be selected according to the arrangement of at least one conduction layer 6. For example, in FIG. 2, only two flat layers may be provided between the at least one conduction layer 6 and the second pixel drive circuit 21, and only one flat layer may be provided between the at least one conduction layer 6 and the second light emitting device 22, the display substrate 100 may comprise three flat layers stacked in sequence. For example, as shown in FIG. 3, at least one conduction layer 6 may comprise a first conduction layer 61, a second conduction layer 62, and a third conduction layer 63. In this case, the display substrate 100 may comprise five flat layers stacked in sequence.

In some embodiments, in the case where at least one conduction layer 6 may comprise a first conduction layer 61, a second conduction layer 62, and a third conduction layer 63, one of the first conduction layer 61, the second conduction layer 62 and the third conduction layer 63 may be electrically connected to the second light emitting device 22 capable of emitting red light, and the other layer of the first conduction layer 61, the second conduction layer 62 and the third conduction layer 63 may be electrically connected to the second light emitting device 22 capable of emitting green light, and the remaining layer of the first conduction layer 61, the second conduction layer 62, and the third conduction layer 63 may be electrically connected to the second light emitting device 22 capable of emitting blue light.

In some examples, the pixel defining layer 8 has a plurality of openings. At least a part of a second light emitting device 22 is provided in each opening. By providing the pixel defining layer 8, the light-emitting regions of each of the first sub-pixel P1 and the second sub-pixel P2 can be defined.

Exemplarily, as shown in FIGS. 3-4, when the display substrate 100 comprises five layers of flat layers 52, 53, 54, 55, and 56 stacked in sequence, the first sub-retaining wall 4 may comprise, for example, five layers 42, 43, 44, 45, 48, the second sub-retaining wall 5 may comprise, for example, six layers 42, 43, 44, 45, 46, 47.

In some examples, as shown in FIG. 4, the fifth layer 46 comprised in the second sub-retaining wall 5 is overlapped on the fourth layer provided in the same layer 45. Exemplarily, as shown in FIG. 4, the sixth layer 47 comprised in the second sub-retaining wall 5 is overlapped on the fifth layer 46 comprised in the second sub-retaining wall 5 and covers at least a part of the fifth layer 46 comprised in the second sub-retaining wall 5. In some examples, as shown in FIG. 4, the fifth layer 48 comprised in the first sub-retaining wall 4 is overlapped on the fourth layer provided in the same layer 45.

For example, the fifth layer 46 comprised in the second sub-retaining wall 5 extends for about 5 μm above the fourth layer provided in the same layer 45. In the case where the sixth layer 47 comprised in the second sub-retaining wall 5 covers all of the fifth layer 46 comprised in the second sub-retaining wall 5, the sixth layer 47 comprised in the second sub-retaining wall 5 extends above the fifth layer 46 comprised in the second sub-retaining wall 5 by about 5 μm, for example. This helps to reduce the slope angle.

In some embodiments, as shown in FIG. 5, the display substrate 100 further comprises a barrier layer 9. In some examples, as shown in FIG. 5, the first end of the barrier layer 9 extends into the first sub-retaining wall 4, and the second end of the barrier layer 9 extends between the two flat layers 72, 73 comprised in the display substrate.

For example, as shown in FIGS. 3-4, the first end 910 of the barrier layer 9 may be between the second layer provided in the same layer 43 and the third layer provided in the same layer 44. The second end 920 of the barrier layer 9 may be between the second flat layer 53 and the third flat layer 54.

For example, as shown in FIGS. 3-4, the first end 910 of the barrier layer 9 may be between the third layer provided in the same layer 44 and the fourth layer provided in the same layer 45. The second end 920 of the barrier layer 9 may be between the third flat layer 54 and the fourth flat layer 55.

For example, as shown in FIGS. 3-4, the first end 910 of the barrier layer 9 may be between the fourth layer provided in the same layer 45 and the fifth layer 48 comprised in the first sub-retaining wall 4. The second end 920 of the barrier layer 9 may be between the fourth flat layer 55 and the fifth flat layer 56.

It should be understood that the number of barrier layers 9 can be set according to actual needs.

In some embodiments, during the process of preparing and forming the display substrate 100, the thin films are sequentially formed in a sequence. Among them, the thin film formed earlier is close to the substrate 1, and the thin film formed later is far away from the substrate 1. That is, the barrier layer 9 is formed later than the layer that is in contact with the barrier layer 9 and below the barrier layer 9.

By providing the barrier layer 9, the barrier layer 9 can be used to reduce the step differences between the first sub-retaining wall 4 and the multiple flat layers, reducing the rate of change of the step differences. The barrier layer 9 can also be used to block the retaining wall and multiple flat layers to avoid contact between the two which forms a water-oxygen channel, thereby preventing water vapor from entering the display area A, which is beneficial to improve the ability to block water vapor, and avoid encapsulating failure due to water vapor entering the display area A.

In some examples, as shown in FIG. 3, the barrier layer 9 is provided in the same layer as one of the first conduction layer 61, the second conduction layer 62, and the third conduction layer 63, and the barrier layer 9 is not electrically connected to the first conduction layer 61, the second conduction layer 62 or the third conduction layer 63. In this way, it is beneficial to simplify the preparation method of the display substrate 100 and avoid short circuits.

In some examples, as shown in FIG. 5, the orthographic projection of the flat layer 73 on the second end 920 of the barrier layer 9 on the substrate 1 is tangent or overlapped with the orthographic projection of layer 430 provided in the same layer disposed under the first end 910 of the barrier layer 9 on the substrate 1. In this way, the transitional step difference of the film comprised in the display substrate 100 from the frame area B to the display area A can be made smaller, and the yield of the signal transmission line 400 to be formed subsequently can be ensured.

The purpose of the embodiments of the present disclosure is to provide a display substrate and a display device, which are used to improve the encapsulation effect and blocking effect of the display substrate. At the same time, the short circuit or other failures of the signal transmission line due to the residual conductive material in the display device using the display substrate are avoided, and the yield of the display device is improved.

Some embodiments of the present disclosure provide a display device 1000, which comprises the display substrate 100 as described in any of the foregoing embodiments.

The beneficial effects that can be achieved by the above-mentioned display device 1000 are the same as the beneficial effects that can be achieved by the display substrate 100, and will not be repeated here.

The touch structure 200 comprised in the display device 1000 comprises a variety of structures, which may be selected and set according to actual needs.

In some examples, as shown in FIG. 7, the touch structure 200 may comprise a plurality of conductive bridges arranged in an array, and a plurality of rows of first touch sub-electrodes. Each row of the first touch sub-electrodes comprises a plurality of first touch sub-electrodes arranged at intervals along the first direction X. As shown in FIG. 8, in each row of first touch sub-electrodes, every two adjacent first touch sub-electrodes are electrically connected to a conductive bridge through via holes, so that the multiple rows of first touch sub-electrodes and the plurality of conductive bridges constitute a plurality of first touch electrodes.

The touch structure 200 may further comprise a plurality of second touch electrodes extending along the second direction Y. Each second touch electrode comprises a plurality of second touch sub-electrodes connected in series. Exemplarily, each second touch electrode is an integral structure.

Each first touch electrode is electrically connected to the touch driving chip 500 through a signal transmission line 400, and each second touch electrode is electrically connected to the touch driving chip 500 through a signal transmission line 400.

Exemplarily, the signal transmission line 400 comprised in the display device 1000 may be provided in the same layer as the above-mentioned conductive bridge. This is beneficial to simplify the manufacturing process of the display device 1000.

In some embodiments, the above-mentioned display device 1000 may be any product or component with a display function, such as a mobile phone, a tablet computer, a television, a monitor, a notebook computer, a digital photo frame, a navigator, and the like.

The above are only specific implementations of the present disclosure, but the protection scope of the present disclosure is not limited thereto. Any variation or replacement contemplated by those skilled in the art within the technical scope of this disclosure should be covered within the scope of protection of this disclosure. Therefore, the scope of protection of this disclosure shall be subject to the scope of protection of the claims.

The invention claimed is:

1. A display substrate, the display substrate comprising a display area and a frame area, the display substrate comprising:
   a substrate;
   a plurality of sub-pixels on a side of the substrate, the plurality of sub-pixels configured to emit light in the display area;
   an encapsulation layer on a side of the plurality of sub-pixels away from the substrate; and
   a retaining wall in the frame area, wherein the retaining wall is between the encapsulation layer and the substrate and comprises a first sub-retaining wall, a second sub-retaining wall, and a transition area between the first sub-retaining wall and the second sub-retaining wall,
   wherein the second sub-retaining wall is on a side of the first sub-retaining wall away from the display area, a vertical distance between an end of the second sub-retaining wall away from the substrate and the substrate is greater than the vertical distance between an end of the first sub-retaining wall away from the substrate and the substrate, the vertical distance between the end of the first sub-retaining wall away from the substrate and the substrate is greater than a vertical distance between and end of the transition area away from the substrate and the substrate; and wherein, the retaining wall comprises at least one layer provided in a same layer, the at least one layer provided in the same layer continuously extends across the first sub-retaining wall, the second sub-retaining wall and the transition area.

2. The display substrate according to claim 1, wherein the display area comprises a first display area and a second display area, and the plurality of sub-pixels comprise a plurality of first sub-pixels and a plurality of second sub-pixels, wherein the plurality of first sub-pixels are in the first display area, and each first sub-pixel of the plurality of first sub-pixels comprises a first pixel drive circuit and a first light-emitting device electrically connected to the first pixel drive circuit;

each second sub-pixel of the plurality of second sub-pixels comprises a second pixel drive circuit and a second light-emitting device electrically connected to the second pixel drive circuit, the second light-emitting device is in the second display area, the plurality of second sub-pixels comprise a plurality of second pixel drive circuits, at least one second pixel drive circuit of the plurality of second pixel drive circuits is not in the second display area; and the first sub-retaining wall is on a side of the at least one second pixel drive circuit away from the display area.

3. The display substrate according to claim 2, wherein the display substrate comprises a first flat layer, wherein the at least one layer provided in the same layer comprises a first layer provided in the same layer, and wherein, the first layer provided in the same layer is provided in the same layer as the first flat layer.

4. The display substrate according to claim 3, wherein the display substrate further comprises a second flat layer, a third flat layer, and a fourth flat layer sequentially arranged on the first flat layer, the at least one layer provided in the same layer also comprises a second layer provided in the same layer, a third layer provided in the same layer, and a fourth layer provided in the same layer sequentially arranged on the first layer provided in the same layer, and wherein, the second layer provided in the same layer is provided in the same layer as the second flat layer, the third layer provided in the same layer is provided in the same layer as the third flat layer, and the fourth layer provided in the same layer is provided in the same layer as the fourth flat layer.

5. The display substrate according to claim 4, wherein the display substrate further comprises a fifth flat layer on the fourth flat layer, the second sub-retaining wall further comprises a fifth layer on the fourth layer provided in the same layer, and wherein, the fifth layer comprised in the second sub-retaining wall is provided in the same layer as the fifth flat layer, and an orthographic projection of the fifth layer comprised in the second sub-retaining wall on the substrate does not overlap with an orthographic projection of the transition area and the first sub-retaining wall on the substrate.

6. The display substrate according to claim 5, wherein the display substrate further comprises a pixel defining layer on the fifth flat layer, and the second sub-retaining wall further comprises a sixth layer on the fifth layer, the first sub-retaining wall further comprises a fifth layer on the fourth layer provided in the same layer, and wherein, the sixth layer comprised in the second sub-retaining wall, the fifth layer comprised in the first sub-retaining wall, and the pixel defining layer are provided in the same layer, and an orthographic projection of the sixth layer comprised in the second sub-retaining wall on the substrate and the orthographic projection of the fifth layer comprised in the first sub-retaining wall on the substrate do not overlap with the orthographic projection of the transition area on the substrate.

7. The display substrate according to claim 6, further comprising:

at least one conduction layer, wherein the second pixel drive circuit in the frame area is electrically connected to a corresponding second light emitting device through the at least one conduction layer, and wherein the display substrate further comprises a flat layer between the at least one conduction layer and the second pixel drive circuit, and a flat layer between the at least one conduction layer and the second light emitting device.

8. The display substrate according to claim 7, wherein the at least one conduction layer comprises a plurality of conduction layers, and wherein the display substrate further comprises a flat layer between two adjacent conduction layers among the plurality of conduction layers.

9. The display substrate according to claim 8, wherein the plurality of conduction layers comprise a first conduction layer, a second conduction layer, and a third conduction layer, and the display substrate comprises the first flat layer, the second flat layer, the third flat layer, the fourth flat layer and the fifth flat layer sequentially arranged on the substrate, wherein the second pixel drive circuit is between the substrate and the first flat layer, wherein the first conduction layer is between the second flat layer and the third flat layer, wherein the second conduction layer is between the third flat layer and the fourth flat layer, wherein the third conduction layer is between the fourth flat layer and the fifth flat layer, and wherein the second light emitting device is on a side of the fifth flat layer away from the substrate.

10. The display substrate according to claim 7, wherein the at least one conduction layer is light-transmissive.

11. The display substrate according to claim 9, further comprising:

a barrier layer, wherein a first end of the barrier layer extends into the first sub-retaining wall, and a second end of the barrier layer extends between the two flat layers comprised in the display substrate.

12. The display substrate according to claim 11, wherein the first end of the barrier layer is between the second layer provided in the same layer and the third layer provided in the same layer, and the second end of the barrier layer is between the second flat layer and the third flat layer.

13. The display substrate according to claim 11, wherein the first end of the barrier layer is between the third layer provided in the same layer and the fourth layer provided in the same layer, and the second end of the barrier layer is between the third flat layer and the fourth flat layer.

14. The display substrate according to claim 11, wherein the first end of the barrier layer is between the fourth layer provided in the same layer and the fifth layer comprised in the first sub-retaining wall, and the second end of the barrier layer is between the fourth flat layer and the fifth flat layer.

15. The display substrate according to claim 11, wherein the barrier layer is provided in the same layer as one of the first conduction layer, the second conduction layer, and the third conduction layer, and the barrier layer is not electrically connected to the first conduction layer, the second conduction layer or the third conduction layer.

16. The display substrate according to claim 1, wherein the encapsulation layer comprises:
    a first inorganic layer on the retaining wall;
    an organic layer on a side of the first inorganic layer away from the substrate; and
    a second inorganic layer on a side of the organic layer away from the substrate.

17. The display substrate according to claim 2, wherein at least one second pixel drive circuit of the plurality of second pixel drive circuits is in the frame area.

18. The display substrate according to claim 16, wherein the organic layer is prepared by a printing process.

19. A display device, comprising:
    the display substrate according to claim 1; and,
    an optical device on the opposite side of a light-emitting side of the display substrate,
    wherein, at least part of a second display area of the display substrate is in a field of view of the optical device.

20. The display device according to claim 19, wherein the frame area of the display substrate comprises a binding area,
    the display device further comprises:
    a touch structure on the light-emitting side of the display substrate, an orthographic projection of the touch structure on the substrate at least partially overlaps with an orthographic projection of the display area on the substrate;
    a touch driving chip in the binding area; and
    a plurality of signal transmission lines electrically connected to the touch structure and the touch driving chip,
    wherein orthographic projections of the plurality of signal transmission lines on the substrate at least partially overlap with an orthographic projection of the transition area on the substrate.

* * * * *